United States Patent
Simin et al.

(10) Patent No.: US 9,601,611 B2
(45) Date of Patent: Mar. 21, 2017

(54) LATERAL/VERTICAL SEMICONDUCTOR DEVICE WITH EMBEDDED ISOLATOR

(71) Applicant: Sensor Electronic Technology, Inc., Columbia, SC (US)

(72) Inventors: Grigory Simin, Columbia, SC (US); Mikhail Gaevski, West Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/333,890

(22) Filed: Jul. 17, 2014

(65) Prior Publication Data

US 2015/0021664 A1   Jan. 22, 2015

Related U.S. Application Data

(60) Provisional application No. 61/847,708, filed on Jul. 18, 2013.

(51) Int. Cl.
| | |
|---|---|
| *H01L 29/778* | (2006.01) |
| *H01L 29/205* | (2006.01) |
| *H01L 29/06* | (2006.01) |
| *H01L 29/417* | (2006.01) |
| *H01L 29/20* | (2006.01) |

(52) U.S. Cl.
CPC ...... *H01L 29/7788* (2013.01); *H01L 29/0653* (2013.01); *H01L 29/2003* (2013.01); *H01L 29/41766* (2013.01)

(58) Field of Classification Search
CPC ..... H01L 27/12; H01L 29/744; H01L 29/739; H01L 29/732; H01L 29/78
See application file for complete search history.

(56) References Cited

U.S. PATENT DOCUMENTS

| | | | |
|---|---|---|---|
| 2012/0086045 A1* | 4/2012 | Molin | ............... H01L 21/82348 257/139 |
| 2012/0205667 A1 | 8/2012 | Simin et al. | |
| 2014/0077311 A1 | 3/2014 | Simin et al. | |

OTHER PUBLICATIONS

Kanechika et al, "A Vertical Insulated Gate AlGaN/GaN Heterojunction Field-Effect Transistor", Japanese Journal of Applied Physics, vol. 46, No. 21, 2007, pp. L503-L505.

* cited by examiner

*Primary Examiner* — Fernando L Toledo
*Assistant Examiner* — Lawrence-Linh T Nguyen
(74) *Attorney, Agent, or Firm* — LaBatt, LLC

(57) ABSTRACT

A lateral/vertical device is provided. The device includes a device structure including a device channel having a lateral portion and a vertical portion. The lateral portion of the device channel can be located adjacent to a first surface of the device structure, and one or more contacts and/or a gate can be formed on the first surface. The device structure also includes a set of insulating layers located in the device structure between the lateral portion of the device channel and a second surface of the device structure opposite the first surface. An opening in the set of insulating layers defines a transition region between the lateral portion of the device channel and a vertical portion of the device channel. A contact to the vertical portion of the device channel can be located on the second surface.

21 Claims, 6 Drawing Sheets

LATERAL/VERTICAL SEMICONDUCTOR DEVICE WITH EMBEDDED ISOLATOR

REFERENCE TO RELATED APPLICATIONS

The current application claims the benefit of U.S. Provisional Application No. 61/847,708, titled "Lateral Vertical Semiconductor Device with Embedded Isolator," which was filed on 18 Jul. 2013, and which is hereby incorporated by reference.

TECHNICAL FIELD

The disclosure relates generally to semiconductor devices, and more particularly, to an improved semiconductor device design.

BACKGROUND ART

In power semiconductor devices, achieving the highest breakdown voltage simultaneously with minimal on-resistance is one of the most important performance characteristics. Lateral geometry devices, such as field-effect transistors (FETs), including metal oxide semiconductor FETs (MOSFETs), metal semiconductor FETs (MESFETs), high electron mobility transistors (HEMTs), etc., have a channel aligned along the semiconductor surface, and which is often located close to the semiconductor surface. If the space-charge (depletion) region occupies only a portion of the gate-drain spacing, the electric field in that spacing is strongly non-uniform and can result in premature breakdown, which limits the device performance. Due to a high carrier concentration in the channel and the close vicinity of the channel to the semiconductor surface, efficient control over the space charge distribution in the gate-drain spacing is extremely challenging. This problem is particularly important in wide bandgap devices with high electron density in the channel and polarization charges induced at heterointerfaces, which impede channel depletion over a large gate-drain spacing.

One approach to lower the peak electric field near the gate edge is the use of one or more field-modulating plates (FPs), which can be connected to either the gate, source, or drain electrode. FIG. 1 shows a conventional heterostructure FET (HFET) 2 including a field plate FP according to the prior art. The field plate structure decreases the peak field near the gate electrode edge by splitting it into two peaks, thereby increasing the breakdown voltage for the device.

However, even multiple field plate structures, which split the electric field into even more peaks, cannot achieve a uniform electric field in the device channel. Additionally, a device including field plate(s) can suffer from premature breakdown between the field plate(s) and the drain electrode. Furthermore, the field plate(s) increases the inter-electrode and electrode-semiconductor capacitances and therefore decreases the device maximum operating frequency.

As a result of the above limitations, current high-voltage FET switches including field plates do not achieve the breakdown voltages predicted by fundamental material properties and have on-resistances higher than that expected from the material properties.

Another approach proposes a device that combines a lateral source-gate region and a vertical (perpendicular to the device surface) gate-drain drift region. FIG. 2 shows an illustrative lateral/vertical device 4 according to the prior art. Such devices 4 have been fabricated in silicon (Si), gallium arsenide (GaAs), silicon carbide (SiC), and other material systems. These devices 4 include buried p-doped layers (e.g., p-GaN shown in FIG. 2) for high voltage blocking, isolation, and current control.

However, inclusion of buried p-doped layers can have drawbacks. For example, formation of the p-doped islands buried in n-type material can be difficult. Furthermore, inclusion of the p-doped layers can form parasitic n-p-n transistors, which can lead to excessive leakage and premature breakdown. For devices 4 fabricated using materials from the group III-nitride material system, the combined lateral/vertical approach with buried p-doped layers does not apply well. For example, while group III-nitride based devices offer tremendous performance improvement due to a high breakdown field and other unique material properties, including buried p-doped group III-nitride layers leads to significant degradation of material properties and considerable complications to the growth/fabrication technology, which prevents cost reduction.

SUMMARY OF THE INVENTION

Aspects of the invention provide a lateral/vertical device. The device includes a device structure including a device channel having a lateral portion and a vertical portion. The lateral portion of the device channel can be located adjacent to a first surface of the device structure, and one or more contacts and/or a gate can be formed on the first surface. The device structure also includes a set of insulating layers located in the device structure between the lateral portion of the device channel and a second surface of the device structure opposite the first surface. An opening in the set of insulating layers defines a transition region between the lateral portion of the device channel and a vertical portion of the device channel. A contact to the vertical portion of the device channel can be located on the second surface.

A first aspect of the invention provides a lateral/vertical device comprising: a device structure including a device channel, wherein the device channel includes a lateral portion, a vertical portion, and a transition region between the lateral portion and the vertical portion; a first contact to the lateral portion of the device channel; a gate to the transition region of the device channel; a second contact to the vertical portion of the device channel, wherein the first and second contacts are located on opposing surfaces of the device structure; and a set of insulating layers located in the device structure between the lateral portion of the device channel and the second contact, wherein an opening in the set of insulating layers defines the transition region of the device channel.

A second aspect of the invention provides a lateral/vertical field effect transistor comprising: a heterostructure including a device channel adjacent to a first surface of the device structure, wherein the device channel includes a lateral portion, a vertical portion, and a transition region between the lateral portion and the vertical portion; a first contact to the lateral portion of the device channel located on the first surface; a gate to the transition region of the device channel located on the first surface; a second contact to the vertical portion of the device channel, wherein the second contact is located on an opposing surface of the device structure as the first surface; and a set of insulating layers located in the device structure between the lateral portion of the device channel and the second contact, wherein an opening in the set of insulating layers is located between the gate and the second contact and defines the transition region of the device channel.

A third aspect of the invention provides a lateral/vertical device comprising: a device structure including a lateral portion of a device channel located adjacent to a first surface of the device structure, wherein the device structure includes a set of insulating layers located in the device structure between the lateral portion of the device channel and a second surface of the device structure opposite the first surface, and wherein an opening in the set of insulating layers defines a transition region between the lateral portion of the device channel and a vertical portion of the device channel.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a lateral/vertical device. The device includes a device structure including a device channel having a lateral portion and a vertical portion. The lateral portion of the device channel can be located adjacent to a first surface of the device structure, and one or more contacts and/or a gate can be formed on the first surface. The device structure also includes a set of insulating layers located in the device structure between the lateral portion of the device channel and a second surface of the device structure opposite the first surface. An opening in the set of insulating layers defines a transition region between the lateral portion of the device channel and a vertical portion of the device channel. A contact to the vertical portion of the device channel can be located on the second surface.

As used herein, unless otherwise noted, the term "set" means one or more (i.e., at least one) and the phrase "any solution" means any now known or later developed solution. Furthermore, as used herein, a normally-on device channel means a device channel that is in a conducting state when no external voltage or electric field is applied to it, and a normally-off device channel means a device channel that is in a non-conducting state when no external voltage or electric field is applied to it. As also used herein, an insulating material means a material having a resistivity above $10^{10}$ Ohm×cm; a semi-insulating material means a material having a resistivity in a range of $10^{10}$-$10^{5}$ Ohm×cm; a semiconductor means a material having a resistivity in a range of $10^{5}$-$10^{-3}$ Ohm×cm; and a metal or semi-metal means a material having a resistivity below $10^{-3}$ Ohm×cm.

Figure 1:
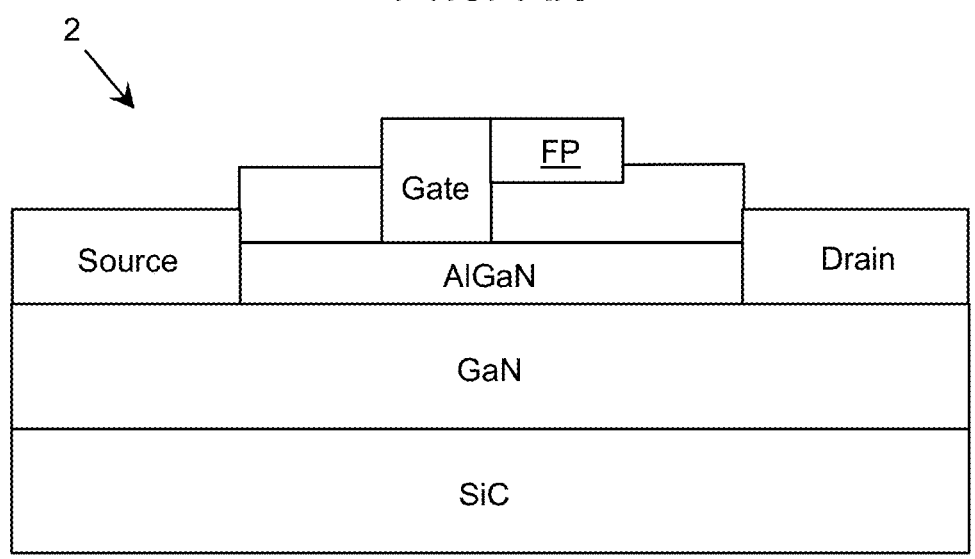
FIG. 1 shows a conventional heterostructure field effect transistor (HFET) including a field plate according to the prior art.
Figure 2:
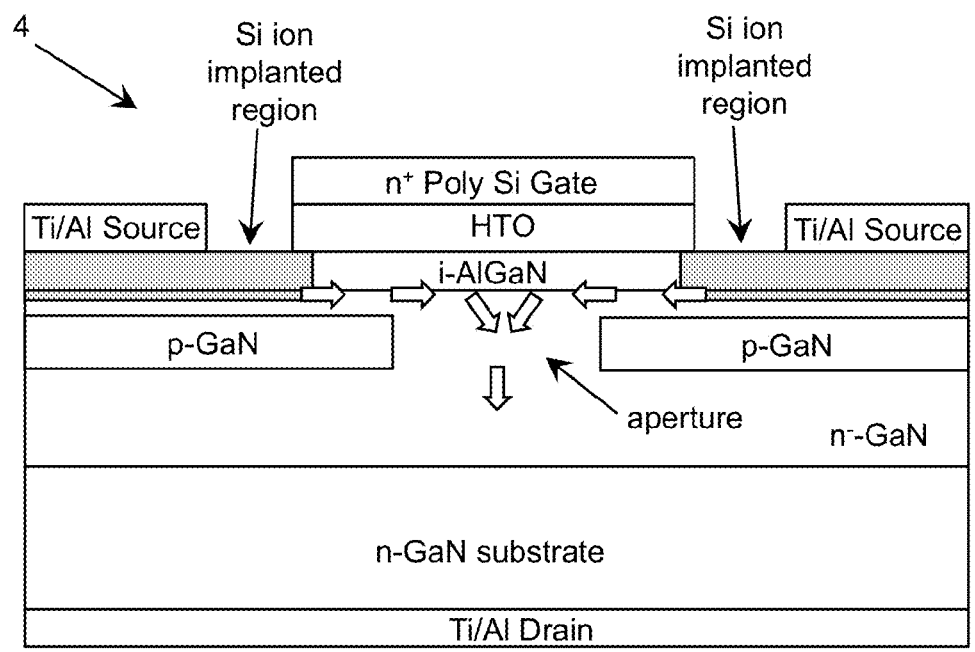
FIG. 2 shows an illustrative lateral/vertical device according to the prior art.
Figure 3A:
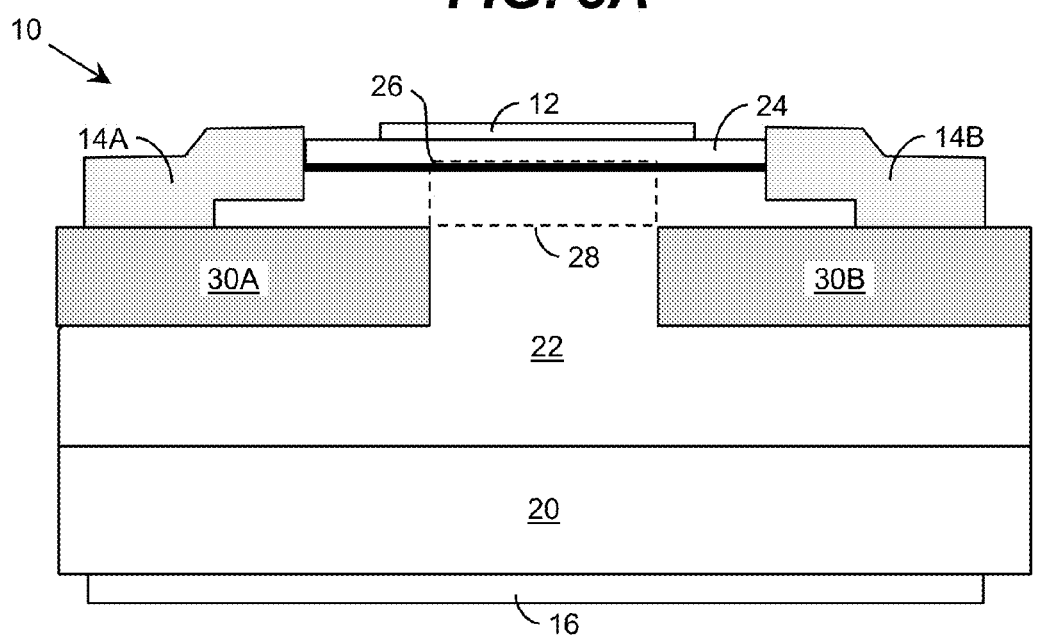
FIGS. 3A and 3B show an illustrative lateral/vertical device according to an embodiment.
Figure 3B:
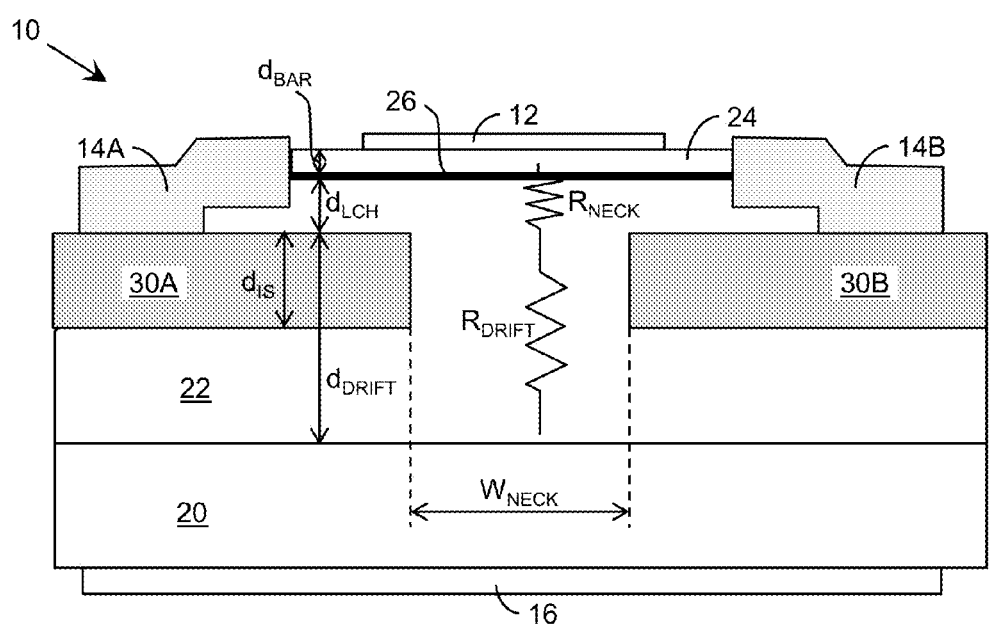

Turning to the drawings, FIGS. 3A and 3B show an illustrative lateral/vertical device 10 according to an embodiment. As illustrated, the device 10 includes a lateral source-gate region defined by a gate 12 and source surface structures 14A, 14B, and a vertical gate-drain (drift) region defined by the gate 12 and a drain surface structure 16, which is located on a surface of the device 10 opposite that of a surface on which the gate 12 and the source surface structures 14A, 14B are located. To this extent, a channel 26 of the device 10 can have a lateral portion (e.g., extending between the source surface structures 14A, 14B), a vertical portion (e.g., extending between the gate 12 and the drain surface structure 16, and a transition region 28 between the lateral portion and the vertical portion.

In an embodiment, the device 10 can be configured to operate as a field effect transistor (FET). The gate 12 can be formed using any solution. To this extent, the gate 12 can comprise an electrode, which forms a Schottky or metal-insulator type contact to a channel 26 of the device 10. In an embodiment, the gate 12 is formed of a metal. Similarly, the source surface structures 14A, 14B and the drain surface structure 16 can be formed of a metal, or the like, using any solution. Additionally, the device 10 and/or one or more of the gate 12, source surface structures 14A, 14B, and/or the drain surface structure 16, can include one or more additional features, which are configured to provide one or more operating characteristics for the device 10.

The device 10 can be formed of a heterostructure. To this extent, the device 10 can include a buffer layer 20, a channel layer 22, and a barrier layer 24. As illustrated, the channel 26 can be formed at a heterointerface between the channel layer 22 and the barrier layer 24. The channel 26 can comprise, for example, a two-dimensional carrier gas, such as a two-dimensional electron gas (2DEG). In an illustrative embodiment, the layers 20, 22, 24 are formed using group III-nitride materials. For example, the buffer layer 20 can comprise n-type gallium nitride (GaN), e.g., a low-doped or a semi-insulating buffer layer, the channel layer 22 can comprise gallium nitride (GaN), and the barrier layer 24 can be aluminum gallium nitride (AlGaN) or aluminum indium nitride (AlInN). However, it is understood that use of these group III-nitride materials or group III-nitride materials in general, is only illustrative of various types of materials/solutions for forming the channel 26 for the device 10. To this extent, the channel 26 can be formed by, for example, another type of heterostructure, channel doping, channel inversion, forming a quantum well or multiple quantum well region, and/or the like.

While a heterostructure FET is shown as an illustrative device 10, it is understood that the device 10 can comprise a FET formed using another approach, such as a doped channel, a metal-oxide-semiconductor (MOS), and/or the like. To this extent, a semiconductor described herein can be formed of any type of semiconductor material. Illustrative semiconductor materials include: silicon (Si), silicon carbide (SiC), germanium (Ge), zinc oxide (ZnO), various types of group III-V or II-VI compound materials, and/or the like. Illustrative group III-V materials include group III nitride materials, which include one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include AlN, GaN, InN, BN, AlGaN, AlInN, AlBN, InGaN, GaBN, AlGaInN, AlGaBN, AlInBN, and AlGaInBN with any molar fraction of group III elements. Additional illustrative group III-V materials include GaAs, GaAlAs, InGaAs, indium phosphorus (InP), and/or the like. Similarly, a device described herein can include a substrate (e.g., located below the buffer layer 20 or instead of the buffer layer 20) formed of any of various types of compound semiconductor or dielectric materials, including, for example: sapphire; diamond; mica; ceramic; germanium (Ge); various types of group III nitride substrates including GaN, AlN, BN, AlGaN, AlGaInN, GaBN, AlBN, AlInBN, AlGaBN, and/or the like; $LiGaO_2$, $LiNbO_2$, ZnO; Si; SiC; GaAs; and/or the like. Furthermore, the substrate can comprise a conducting and/or semiconducting substrate.

Isolation between the lateral source-gate region and the vertical gate-drain region of the device 10 can be provided by a set of embedded insulating layers 30A, 30B. As illustrated, an embedded insulating layer 30A, 30B can be located between a corresponding source surface structure 14A, 14B and the drain surface structure 16. Furthermore, each insulating layer 30A, 30B can have a lateral extent that is at least as large as a lateral extent of the corresponding source surface structure 14A, 14B. As illustrated, each insulating layer 30A, 30B can extend laterally such that a portion of the insulating layer 30A, 30B is below a portion of the gate 12. When multiple insulating layers 30A, 30B are included in the device 10, the insulating layers 30A, 30B can be located on a similar vertical plane and be separated by a lateral distance, which defines a lateral extent of the transition region 28.

The insulating layers 30A, 30B can be formed of any suitable type of insulating material, including, for example, a dielectric material such as silicon dioxide ($SiO_2$). However, it is understood that this is only illustrative of various types of insulating materials that can be utilized. Additional illustrative materials include silicon nitride ($Si_3N_4$), aluminum oxide ($Al_2O_3$), and/or the like. Additionally, an insulating layer 30A, 30B can comprise an air gap, or the like, which is formed within the device 10 using any solution.

Use of the insulating layers 30A, 30B to provide isolation between the lateral source-gate region and the vertical gate-drain region of the device 10 can reduce and/or eliminate one or more problems with previous approaches. For example, fabrication of the device 10 does not require formation of embedded p-type layers, which can be detrimental, particularly for group III-nitride based devices 10. Furthermore, use of the insulating layers 30A, 30B can eliminate or reduce: formation of parasitic transistors; gate-drain and source-drain capacitances; premature breakdown; and/or the like. As a result, the device 10 can have a higher operating voltage and/or a higher maximum power than that provided by comparable devices (e.g., same size, semiconductor materials, and/or the like) fabricated using previous approaches.

A device 10 including the insulating layers 30A, 30B can be fabricated using any solution. For example, the insulating layers 30A, 30B can be fabricated during the epitaxial growth of the channel layer 22 using an epitaxial lateral overgrowth (ELOG) technique, migration enhanced lateral epitaxial overgrowth (MELEO). Furthermore, the insulating layers 30A, 30B can be fabricated using etching, such as laterally etching the channel layer 22 below the channel 26, and/or the like.

Various attributes of the device 10 can be configured based on one or more target operating features of the device. For example, the device 10 can have a low on-resistance in the source-gate region by forming a channel 26 from a two-dimensional electron gas having a high density and a low sheet resistance. Such a channel 26 can be formed, for example, at an AlGaN/GaN heterointerface, an AlInN/GaN heterointerface, using a doped channel, and/or the like. The device 10 can have a low on-resistance and/or a high blocking voltage in the gate-drain region through the use of a doping level in the gate-drain region and/or a width of the gate-drain opening that are optimized for the operating features.

A discussion of an illustrative configuration of various attributes of the device 10 based on one or more target operating features of the device 10 is described in conjunction with FIG. 3B, which shows the device 10 with an equivalent circuit superimposed thereon according to an embodiment.

In the presence of the interface channel 26 (e.g., a 2DEG-channel), the whole lateral channel includes the channel 26 and a lateral portion of the channel layer 22 of a thickness, $d_{LCH}$, between the source structures 14A, 14B of the device 10. In an embodiment, the thickness $d_{LCH}$ can be selected based on a target threshold voltage, $V_{TH}$, of the device 10. For example, the lateral channel thickness $d_{LCH}$ can be determined from:

$$V_{TH} = Q_{LCH}/C_{GCH}, \qquad (1)$$

where $Q_{LCH}$ is the mobile charge in the lateral portion of the channel, which can be calculated by $Q_{LCH}=qN_{SH}$, where $N_{SH}$ is the sheet electron density in the lateral channel and q is the magnitude of the electrical charge on the electron, and where $C_{GCH}$ is the gate to lateral channel capacitance. For an illustrative case of the barrier layer 24 having a thickness, $d_{BAR}$, much less than a thickness of the lateral channel layer $d_{LCH}$, (e.g., $d_{BAR} \ll d_{LCH}$), the lateral channel capacitance $C_{GCH}$ relates to the lateral channel layer thickness $d_{LCH}$ approximately as $C_{GCH} \approx \in \in_0 W_{NECK} W/d_{LCH}$, where $\in$ is the dielectric permittivity of the channel material, $\in_0$ is vacuum permittivity (e.g., electric constant), $W_{NECK}$ is a width of the lateral to vertical transition window (e.g., the "neck"), and W is a total width of the device 10 (in a direction perpendicular to a plane of the FIG. 3B). Using these equations, a combination of $N_{SH}$ and $d_{LCH}$ can be selected based on the target threshold voltage. For example, for a target threshold voltage $V_{TH}$ of three volts, combinations of $N_{SH}$ and $d_{LCH}$ capable of providing the target threshold voltage $V_{TH}$ include:

$N_{SH}=6\times10^{11}$ cm$^{-2}$; $d_{LCH}=0.5$ μm;

$N_{SH}=6\times10^{12}$ cm$^{-2}$, $d_{LCH}=0.05$ μm; and/or the like.

A doping level in the vertical gate-drain (drift) region, $N_{DR}$, can be chosen based on a target breakdown voltage, $V_{max}$. For example, the breakdown voltage $V_{max}$ can be calculated as:

$$V_{max} = \frac{\varepsilon \varepsilon_0 F_{BD}^2}{2qN_{DR}}, \qquad (2)$$

where $F_{BD}$ is a breakdown field for the material of the channel layer 22, $\in$ is the dielectric permittivity (e.g., dielectric constant) of the material, and $\in_0$ is vacuum permittivity (e.g., electric constant). Using GaN having a $F_{BD}=3\times10^6$ V/cm as an illustrative material for the channel layer 22 and a target breakdown voltage $V_{max}=1000$ Volts, from equation (2) a selected doping level in the drift region $N_{DR}=2.24\times10^{16}$ cm$^{-3}$.

A vertical channel (drift region) thickness, $d_{DRIFT}$, can be found using the equation:

$$V_{max} = \frac{1}{2} F_{BD} d_{DRIFT}. \quad (3)$$

Again using GaN having a $F_{BD}=3\times10^6$ V/cm as an illustrative material for the channel layer 22 and a target breakdown voltage $V_{max}=1000$ Volts, from equation (3), $d_{DRIFT}=6.67$ μm.

A thickness of each of the embedded insulating layers 30A, 30B, $d_{IS}$, can be configured to eliminate premature breakdown in the device 10 through the insulating layers 30A, 30B and/or to achieve low gate-drain and/or source-drain capacitances. For example, to ensure that no premature breakdown occurs across the insulating layers 30A, 30B, the thickness $d_{IS}$ can be selected to be greater than $V_{max}/F_{IS}$, where $F_{IS}$ is a breakdown field of the material forming the corresponding insulating layer 30A, 30B. Using $SiO_2$ having a $F_{IS}$ greater than 6 MV/cm as an illustrative material, $d_{IS}$ can be greater than 3 μm for a target breakdown voltage $V_{max}=1000$ Volts.

A width of the lateral to vertical transition window (e.g., the "neck"), $W_{NECK}$, can be selected based on one or more target operating attributes of the device. For example, a lateral channel resistance under half of the length of the gate 12 (in the neck region), $R_{LATG}$, can be selected to be close to that of the vertical channel resistance, $R_{DRIFT}$. In this case, the following equations can be utilized:

$$R_{LATG} = R_{DRIFT}$$

$$R_{LATG} = R_{SHG} \frac{W_{neck}/2}{W}$$

$$R_{DRIFT} = \rho \frac{d_{DRIFT}}{(W_{neck}/2)}$$

$$W_{NECK} = 2\sqrt{\frac{\rho d_{DRIFT}}{R_{SH}}}$$

where $R_{SHG}$ is the lateral channel resistance under the gate 12, W is a total width of the device 10 (in a direction perpendicular to a plane of the FIG. 3B), and ρ is a resistivity of the material in the vertical portion of the channel. When non-uniform doping is utilized, the $R_{DRIFT}$ can be calculated in a manner that accounts for the non-uniform doping using any solution.

Figure 4:
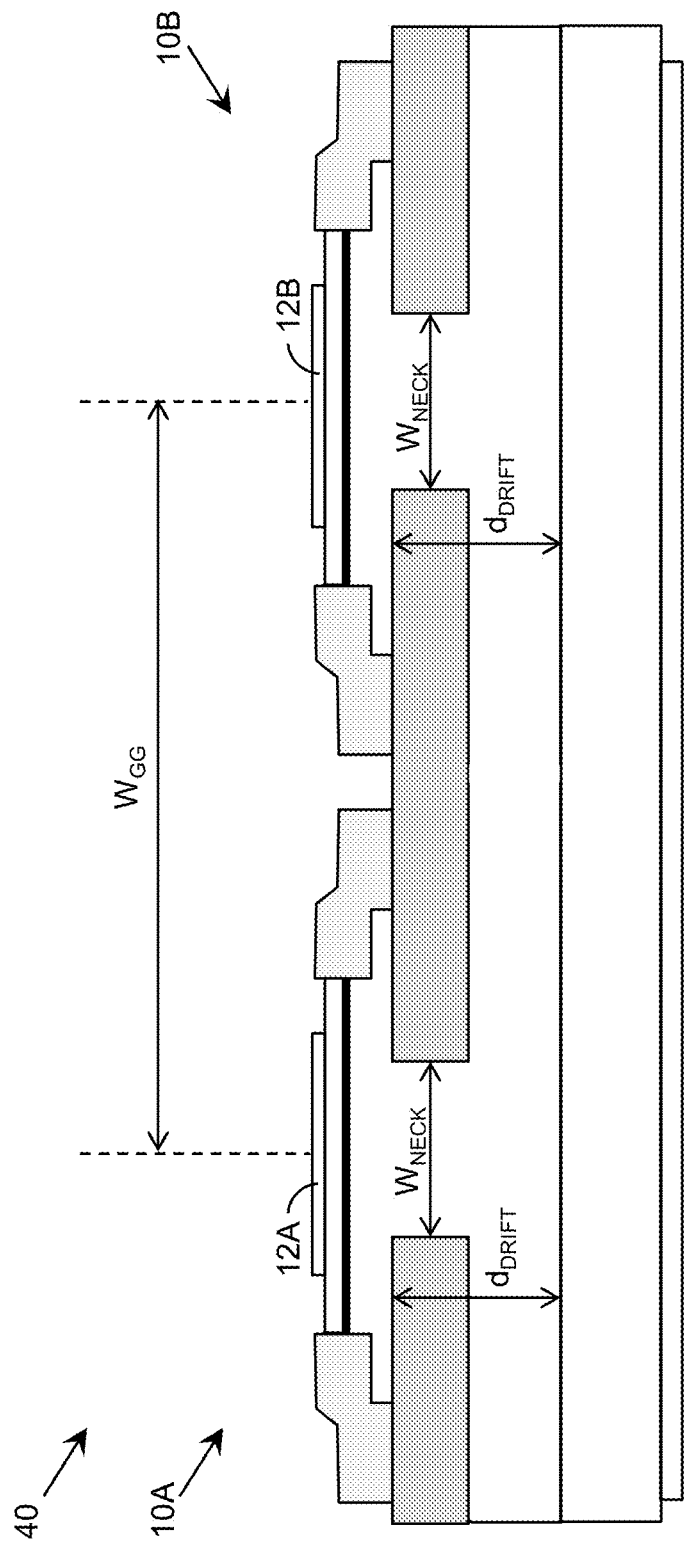
FIG. 4 shows an illustrative multifinger lateral/vertical device according to an embodiment.

An embodiment provides a device having a large-periphery layout. For example, the device layout can form a periodic structure with multiple channels connected in parallel, e.g., by a multi-finger configuration. To this extent, FIG. 4 shows an illustrative multi-finger lateral/vertical device 40 according to an embodiment. In particular, the device 40 is formed from a plurality of adjacent lateral/vertical field effect transistors 10A, 10B, each of which includes a corresponding gate 12A, 12B, respectively. The gates 12A, 12B can have a layout forming the multi-finger configuration as is known in the art. In this case, each FET 10A, 10B can be designed and configured using a solution described herein. In addition, a gate-to-gate width, $W_{GG}$, as measured between the centers of the gates 12A, 12B, can be configured based on a target current spreading in the drift region and/or a target on-resistance for the device 40. For example, the gate-to-gate width $W_{GG}$ can be configured such that $(W_{GG}-W_{NECK})>d_{DRIFT}$. In a more particular embodiment, $(W_{GG}-W_{NECK})\approx 2*d_{DRIFT}$. Under this condition, due to current spreading in a vertical portion of the channel layer 22, an effective width of the vertical channel can exceed the width of the lateral to vertical transition window $W_{NECK}$ by a factor of approximately 1.5 to 2, thereby further reducing an on-resistance for the device 10.

Aspects of the invention are shown and described primarily with reference to a heterostructure field effect transistor. However, it is understood that aspects of the invention can be implemented in various types of field-effect transistors, including, for example, a field-effect transistor, a heterostructure field-effect transistor, an insulated gate field-effect transistor, an insulated gate heterostructure field-effect transistor, a multiple heterostructure field-effect transistor, a multiple heterostructure insulated gate field-effect transistor, an inverted field-effect transistor, an inverted heterostructure field-effect transistor, an inverted insulated gate field-effect transistor, an inverted insulated gate heterostructure field-effect transistor, an inverted multiple heterostructure field-effect transistor, an inverted insulated gate multiple heterostructure field-effect transistor, and/or the like. Additionally, as described herein, aspects of the invention can be implemented in other types of semiconductor devices, including for example, a diode of any type, a semiconductor resistor, a semiconductor sensor, a light emitting diode, a laser, an integrated element, and/or the like.

Figure 5:
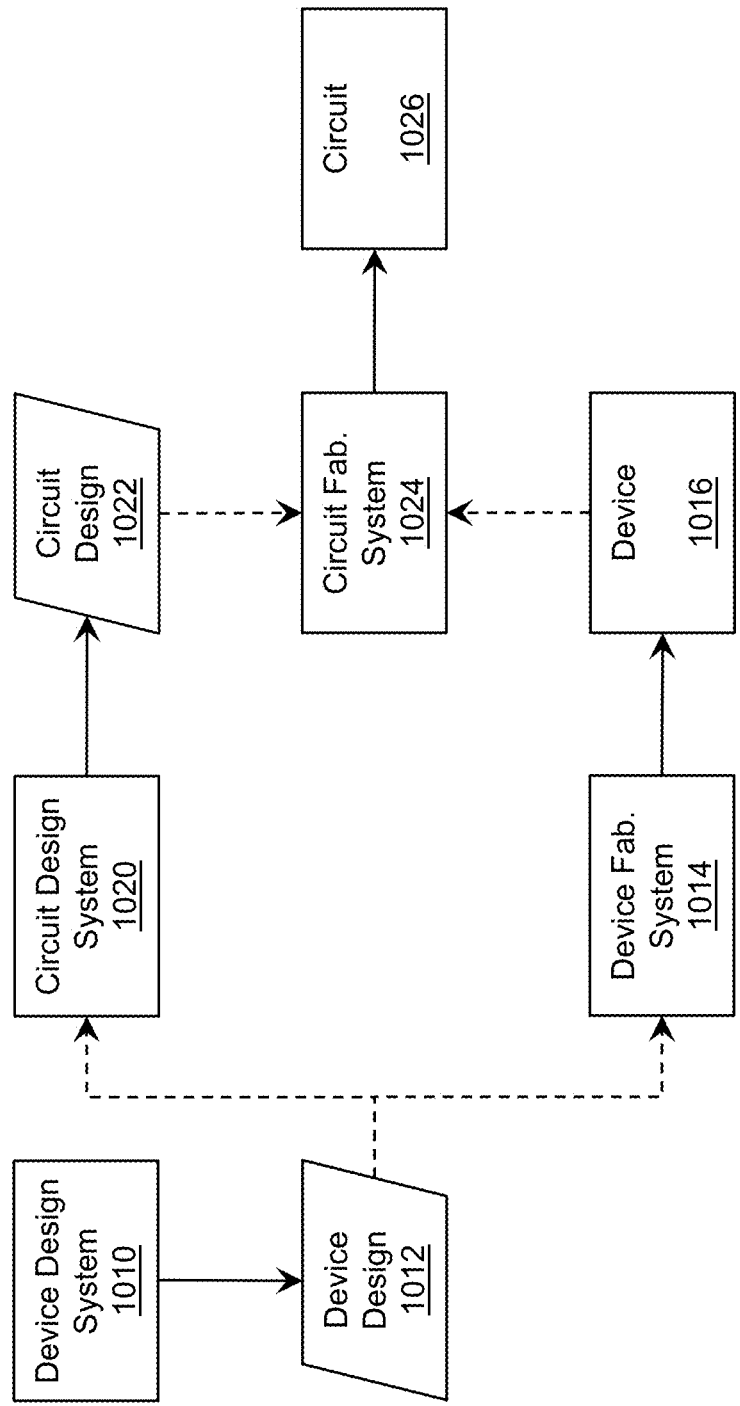
FIG. 5 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 5 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A lateral/vertical device comprising:
a device structure including a device channel, wherein the device channel includes a lateral portion, a vertical portion, and a transition region between the lateral portion and the vertical portion;
a first contact to the lateral portion of the device channel;
a gate to the transition region of the device channel;
a second contact to the vertical portion of the device channel, wherein the first and second contacts are located on opposing surfaces of the device structure;
a set of insulating layers located in the device structure between the lateral portion of the device channel and the second contact, wherein an opening in the set of insulating layers defines the transition region of the device channel; and
a channel layer located between the set of insulating layers and the second contact, and within the opening in the set of insulating layers.

2. The device of claim 1, wherein the device is a field-effect transistor.

3. The device of claim 1, wherein the set of insulating layers are formed of a dielectric material.

4. The device of claim 1, wherein at least one of the set of insulating layers is formed of an air gap.

5. The device of claim 1, wherein the gate forms one of: a Schottky or a metal-insulator contact to the device channel.

6. The device of claim 1, wherein the device structure comprises a heterostructure, and wherein the lateral portion of the device channel is formed at a heterointerface between two layers in the heterostructure.

7. The device of claim 6, wherein the heterostructure includes a plurality of layers formed of group III nitride-based materials.

8. The device of claim 1, wherein the device has a multi-finger layout configuration, and wherein a width of the opening is at least two times smaller than a gate-to-gate distance for adjacent gates.

9. A lateral/vertical field effect transistor comprising:
a heterostructure including a device channel adjacent to a first surface of the device structure, wherein the device channel includes a lateral portion, a vertical portion, and a transition region between the lateral portion and the vertical portion;
a first contact to the lateral portion of the device channel located on the first surface;
a gate to the transition region of the device channel located on the first surface;
a second contact to the vertical portion of the device channel, wherein the second contact is located on an opposing surface of the device structure as the first surface;
a set of insulating layers located in the device structure between the lateral portion of the device channel and the second contact, wherein an opening in the set of insulating layers is located between the gate and the second contact and defines the transition region of the device channel; and
a channel layer located between the set of insulating layers and the second contact, and within the opening in the set of insulating layers.

10. The device of claim 9, wherein the set of insulating layers are formed of a dielectric material.

11. The device of claim 9, wherein the gate forms one of: a Schottky or a metal-insulator contact to the device channel.

12. The device of claim 9, wherein the heterostructure includes a plurality of layers formed of group III nitride-based materials.

13. The device of claim 9, wherein the device has a multi-finger layout configuration, and wherein a width of the opening is at least two times smaller than a gate-to-gate distance for adjacent gates.

14. A lateral/vertical device comprising:
a device structure including a lateral portion of a device channel located adjacent to a first surface of the device structure, wherein the device structure includes a set of insulating layers located in the device structure between the lateral portion of the device channel and a second surface of the device structure opposite the first surface, and wherein an opening in the set of insulating layers defines a transition region between the lateral portion of the device channel and a vertical portion of the device channel;

a first contact to the lateral portion of the device channel on the first surface;

a gate to the transition region of the device channel on the first surface, wherein the gate forms one of: a Schottky or a metal-insulator contact to the transition regions of the device channel; and a second contact to the vertical portion of the device channel on the second surface.

15. The device of claim 1, wherein the first contact includes a set of first contacts and the lateral portion extends between the set of first contacts.

16. The device of claim 1, wherein a lateral extent for each insulating layer is at least as large as a lateral extent for the first contact.

17. The device of claim 14, wherein the set of insulating layers are formed of a dielectric material.

18. The device of claim 14, wherein at least one of the set of insulating layers is formed of an air gap.

19. The device of claim 14, wherein the device structure comprises a heterostructure, and wherein the lateral portion of the device channel is formed at a heterointerface between two layers in the heterostructure.

20. The device of claim 19, wherein the heterostructure includes a plurality of layers formed of group III nitride-based materials.

21. The device of claim 14, wherein the device is a field-effect transistor.

* * * * *